United States Patent
Li et al.

(10) Patent No.: US 7,263,113 B2
(45) Date of Patent: Aug. 28, 2007

(54) LASER POWER CONTROLLER AND METHOD FOR PERFORMING AUTO POWER CONTROL

(75) Inventors: Yung-Chih Li, Taipei Hsien (TW); Hsueh-Kun Liao, Hsin-Chu Hsien (TW); Ching-Chuan Hsu, Hsin-Chu Hsien (TW)

(73) Assignee: Mediatek Incorporation, Hsin-Chu, Hsien (TW)

( * ) Notice: Subject to any disclaimer, the term of this patent is extended or adjusted under 35 U.S.C. 154(b) by 415 days.

(21) Appl. No.: 10/710,970

(22) Filed: Aug. 15, 2004

(65) Prior Publication Data

US 2005/0281300 A1   Dec. 22, 2005

(30) Foreign Application Priority Data

Jun. 16, 2004   (TW) .................. 93117316 A

(51) Int. Cl.
*H01S 3/13* (2006.01)
*H01S 3/00* (2006.01)

(52) U.S. Cl. ................. 372/38.02; 372/29.021

(58) Field of Classification Search ............. 372/29.01, 372/29.011, 29.014, 29.021, 38.01, 38.02, 372/38.07
See application file for complete search history.

(56) References Cited

U.S. PATENT DOCUMENTS

2006/0165139 A1*  7/2006  Sanchez ............... 372/29.021

* cited by examiner

*Primary Examiner*—Armando Rodriguez
(74) *Attorney, Agent, or Firm*—Winston Hsu

(57) ABSTRACT

A laser power controller for performing an auto power control to control the laser power of an optical pick-up unit (OPU) includes: a sample/hold circuit used for sampling and holding a front photodiode output signal to generate an analog feedback signal; an analog-to-digital converter (ADC) electrically coupled to the sample/hold circuit for transferring the analog feedback signal into a digital feedback signal; and a digital control circuit electrically coupled to the ADC for generating a power control signal and outputting the power control signal to the OPU in order to control the laser power of the OPU. The front photodiode output signal corresponds to the laser power of the OPU.

21 Claims, 8 Drawing Sheets

LASER POWER CONTROLLER AND METHOD FOR PERFORMING AUTO POWER CONTROL

BACKGROUND OF INVENTION

1. Field of the Invention

The invention relates to a laser power control circuit and a driving method thereof, and more particularly, to a laser power control circuit and a driving method thereof for implementing a high-speed sample/hold circuit and a digital control mechanism to perform automatic power control.

2. Description of the Prior Art

With the rapid development of technology, the need for electronic information is constantly increasing. Most importantly, electronic information should be quickly stored in a very short time so as to preserve the information for later transmission. Therefore, the storage of electronic information becomes important, and the most popular way to store electronic information is to use an optical recording device.

Generally speaking, an optical recording device often makes use of a laser diode (LD) as the source of light, but the output power of LDs depends on the working temperature, which means that its output power varies slightly over different working temperatures. If the LD output power varies too severely, there will be some errors when writing the data, which results in errors when reading the data. Therefore feedback control circuits are adopted in order to keep the appropriate output power. As is well known in the art, this kind of feedback control circuit is known as an automatic power control (APC) device.

In order to record information on an optical recording medium, the output laser of the LD is modified to have different output power values and recording pulses. Moreover, the power and the widths of the recording pulses need to be control accurately. One key requirement to accomplish automatic power control is to measure the output power of the LD accurately.

Please refer to FIG. 1. FIG. 1 is a diagram of an automatic power control device according to the related art. In FIG. 1, the automatic power control device 100 is electrically coupled to an optical pick-up unit (OPU) 102, which has an LD for projecting a laser on an optical record medium (not shown) so as to perform reading and writing. The automatic power control device 100 includes a sampling circuit 104, an analog-to-digital converter (ADC) 105, a control circuit 108, and a digital-to-analog converter (DAC) 110. Generally speaking, the laser light projected by the LD is received by the front photodiode (FPD) set on the OPU, and the FPD outputs a front photodiode output signal (FPDO). Afterwards, a sampling circuit 104 samples the FPDO, and the ADC 106 transforms the sampled FPDO into a digital signal that can be processed by the control circuit 108. The control signal generated by the control circuit 108 is transformed into an analog signal by the DAC 110 so as to adjust the power of the LD of the OPU 102.

In the related art automatic power control device 100, the sampling circuit 104 is used for sampling the voltage of the FPDO in order to generate a sample signal for feedback control. As shown in FIG. 1, the sampling circuit 104 comprises a variable resister 112, an operational amplifier 113, and a switch 114. The variable resister 112 is capable of generating a first divided voltage L, and the operational amplifier 113 amplifies the first divided voltage L according to a gain so as to generate a second divided voltage H, which means that the second divided voltage H is larger than the first divided voltage L. In the related art automatic power control device 100, the switch 114 changes the voltage inputted into the ADC 106 to be the first divided voltage L or the second divided voltage H corresponding to the FPDO in accordance with whether the OPU 102 outputs high or low power. That is to say, the switch 114 performs switching according to the operation status. Please refer to FIG. 2. FIG. 2 is a diagram of laser power of the optical pick-up unit shown in FIG. 1 according to the related art. Using a CD-RW optical disk driver as an example, the OPU 102 provides a bias power Pb, an erase power Pe, and a write power Pw, wherein the write power Pw is larger than the erase power Pe, and the erase power Pe is larger than the bias power Pb. When the CD-RW optical disk drive performs an erasing operation, the OPU 102 outputs an erase power Pe to warm up a CD-RW disk, and when the CD-RW optical disk driver performs a writing operation, the OPU 102 first outputs a write power Pw to warm up a CD-RW disk, and then outputs a bias power Pb to read the CD-RW disk. For the switch 114, when the OPU 102 outputs the erase Pe or write power Pw, the switch 114 permits the second divided voltage L to be transmitted to ADC 106. On the other hand, when PU 102 outputs the bias power Pb, the switch 114 permits the first divided voltage H to be transmitted to the ADC 106.

However, the sampling structure mentioned above makes an assumption that the response speed of the FPD of the OPU 102 almost equals the impulse variation speed of the laser diode of the OPU 102. That is to say, the FPDO varies according to the impulse variation of each impulse. Therefore, if the data are written at a high speed, the sampling circuit 104 may not be able to perform the sampling operation correctly because of the switching speed of the sampling circuit 114 may not be fast enough. Afterwards, the related art sampling circuit 104 is not capable of sampling the FPDO so as to generate the voltage value. Additionally, in a high-speed or high-intensity optical recording device, the response speed of the FPD may be slower than the impulse variation speed, which might result in that the FPDO remains stable for a very short time during each impulse. Therefore, if the speed of the related art sampling circuit 104 is not fast enough, the related art sampling circuit 104 is not capable of sampling the appropriate voltage values correctly.

As the impulse becomes shorter and shorter, the response speed of the FPD of the OPU is probably slower than the variation speed of the impulse of the laser diode. If the FPDO does not correctly respond the output power of the laser diode, the real output power is not capable of being correctly measured using the FPDO so that the related art automatic power control device 100 is not capable of being applied to high-speed optical recording devices.

SUMMARY OF INVENTION

One objective of the claimed invention is therefore to provide a laser power control circuit and a driving method thereof for implementing a high-speed sample/hold circuit and the digital control mechanism to perform automatic power control, to solve the above-mentioned problem.

According to an exemplary embodiment of the claimed invention, a laser power control circuit used for controlling the laser power of an optical pick-up unit (OPU) is provided. The laser power control circuit comprises: a sample/hold circuit electronically connected to the OPU for sampling and holding a front photodiode output signal to generate an analog feedback signal; an analog-to-digital converter (ADC) electrically coupled to the sample/hold circuit for transferring the analog feedback signal into a digital feedback signal; and a digital control circuit electrically coupled to the ADC for generating a power control signal and outputting the power control signal to the OPU in order to control the laser power of the OPU; wherein the front photodiode output signal corresponds to the laser power of the OPU.

According to another exemplary embodiment of the claimed invention, a method for controlling the power of an OPU is provided. The method comprises: sampling and holding a front photodiode output signal to generate an analog feedback signal; transforming the analog feedback signal into a digital feedback signal; generating a power control signal according to the digital feedback signal, and outputting the power control signal to the OPU so as to control the laser power of the OPU; wherein the front photodiode output signal corresponds to the laser power of the OPU.

The laser power control circuit and the driving method thereof according to the present invention provide a sample/hold circuit that allows the laser power control circuit to be applied in high-speed read-and-write optical recording devices. Additionally, the laser power control circuit and the driving method disclose a digital control circuit that sets the most suitable output power by setting an optimal gain, and thereby modifies the output power to a target power so that the performance of the optical record device is greatly improved. Moreover, sometimes the situations of buffer under-run and malfunction of the disc servo system occur. Because these situations would result in burning interruption, the present invention is capable of outputting a steady state power control signal in a very short time before the linking writing begins, so as to promptly stabilize the power. Therefore the data will not be unreadable, and fatal errors are prevented.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
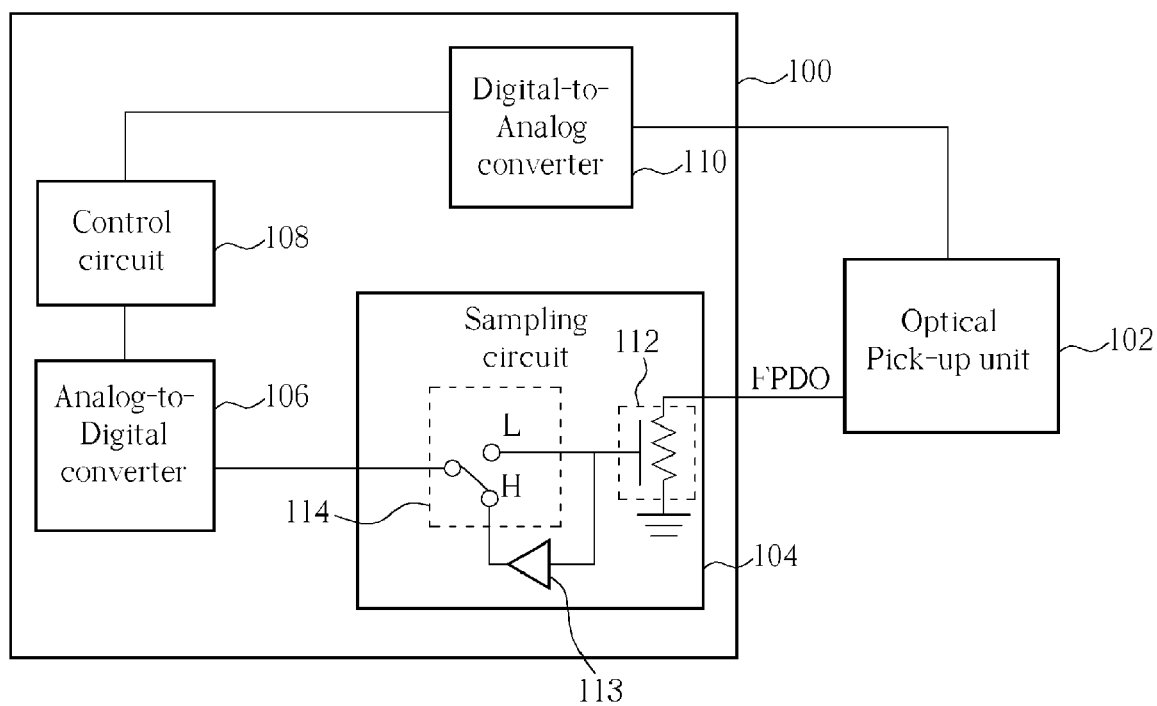
FIG. 1 is a diagram of an automatic power control device according to the related art.
Figure 2:
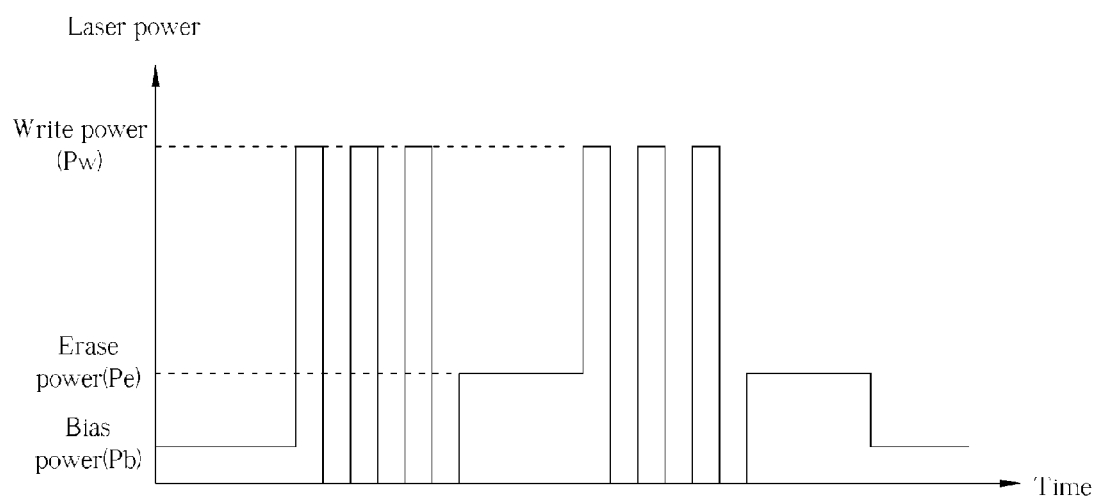
FIG. 2 is a diagram of laser power of the optical pick-up unit shown in FIG. 1 according to the related art.
Figure 3:
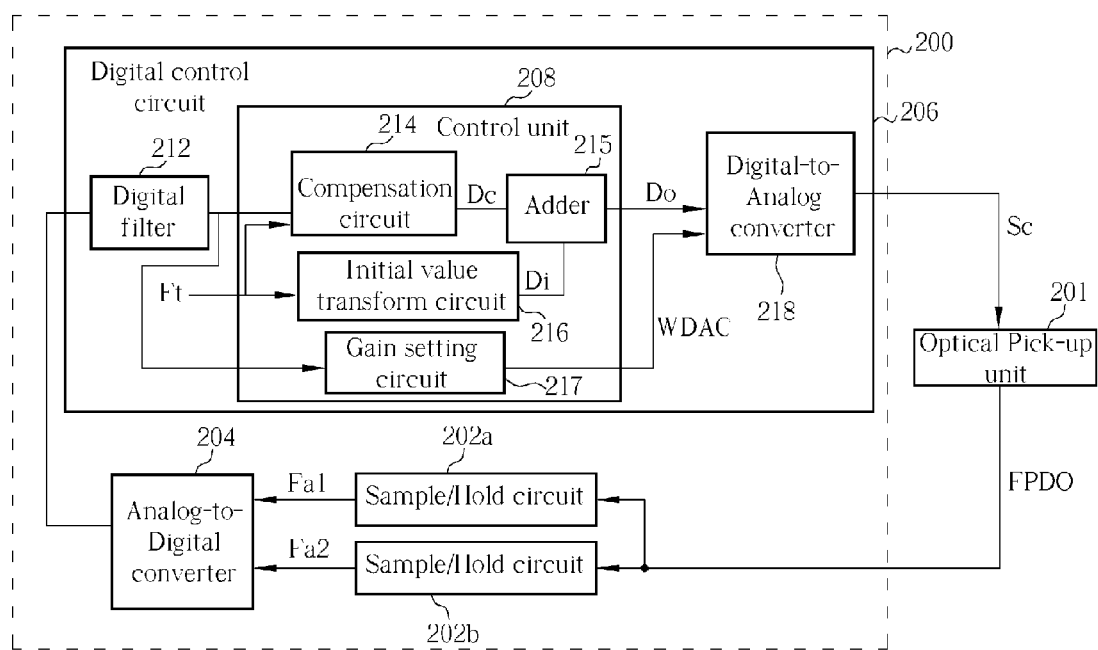
FIG. 3 is a diagram of an embodiment of the automatic power control circuit according to the present invention.

Please refer to FIG. 3. FIG. 3 is a diagram of an embodiment of the automatic power control circuit 200 according to the present invention. If data is to be written onto an optical recording medium (such as an optical disc), the laser power control circuit 200 is used for laser power control to the optical pick-up unit (OPU) 201, which means that the laser power control circuit 200 performs automatic power control (APC). As mentioned above, the OPU 201 sends a front photodiode output signal (FPDO) back to the laser power control circuit 200 so as to perform feedback control. In this embodiment, the laser power control circuit 200 comprises two sample/hold circuits 202a and 202b, an analog-to-digital converter (ADC) 204, and a digital control circuit 206. The digital control circuit 206 includes a control unit 208, a digital filter 212, and a digital-to-analog converter (DAC) 218. The control unit 208 comprises a compensation circuit 214, an adder 215, an initial value transform circuit 216, and a gain setting circuit 217. The sample/hold circuit 202a and 202b are used for sampling and holding the FPDO outputted by the OPU 201 so as to generate two analog feedback signals Fa1 and Fa2. In this embodiment, the laser power control circuit 200 determines either to activate the sample/hold circuit 202a or the sample/hold circuit 202b according to the operation status of the OPU 201. For example, if the OPU 201 outputs the bias power Pb shown in FIG. 2, the sample/hold circuit 202a is used for sampling the FPDO corresponding to the bias power Pb so as to output the analog feedback signal Fa1; and if the if the OPU 201 outputs the write power Pw or the erase power Pe shown in FIG. 2, the sample/hold circuit 202b is used for sampling the FPDO corresponding to the write power Pw or the erase power Pe so as to output the analog feedback signal Fa2. ADC 204 is used for transforming the analog feedback signal Fa1 or Fa2 generated from the sample/hold circuit 202a or 202b into a digital feedback signal Fd, and the digital control circuit 206 generates a power control signal Sc according to a digital feedback signal Fd generated from the ADC 204, so that the laser power control circuit 200 is capable of outputting the power control signal Sc to the OPU 201 to perform the automatic power control operation.

For the digital control circuit 206, the digital filter 212 is used for filtering out the noise generated when the high-speed sample/hold circuits 202a and 202b generate the digital feedback signal Fd, and the initial value transform circuit 216 is used for transforming the digital target feedback signal Ft to an initial power control value Di so as to initialize a power control value Do. The compensation circuit 214 generates a compensation value Dc according to a difference between the digital feedback signal Fd of the initial power control value Di and the digital target feedback signal Ft so as to modify the power control value Do. Furthermore, DAC 218 is used for transforming the power control value Do generated from the control unit 208 into the power control signal Sc so as to perform power control to the OPU 201. The automatic power control operation of the laser power control circuit 200 is illustrated below.

Figure 4:
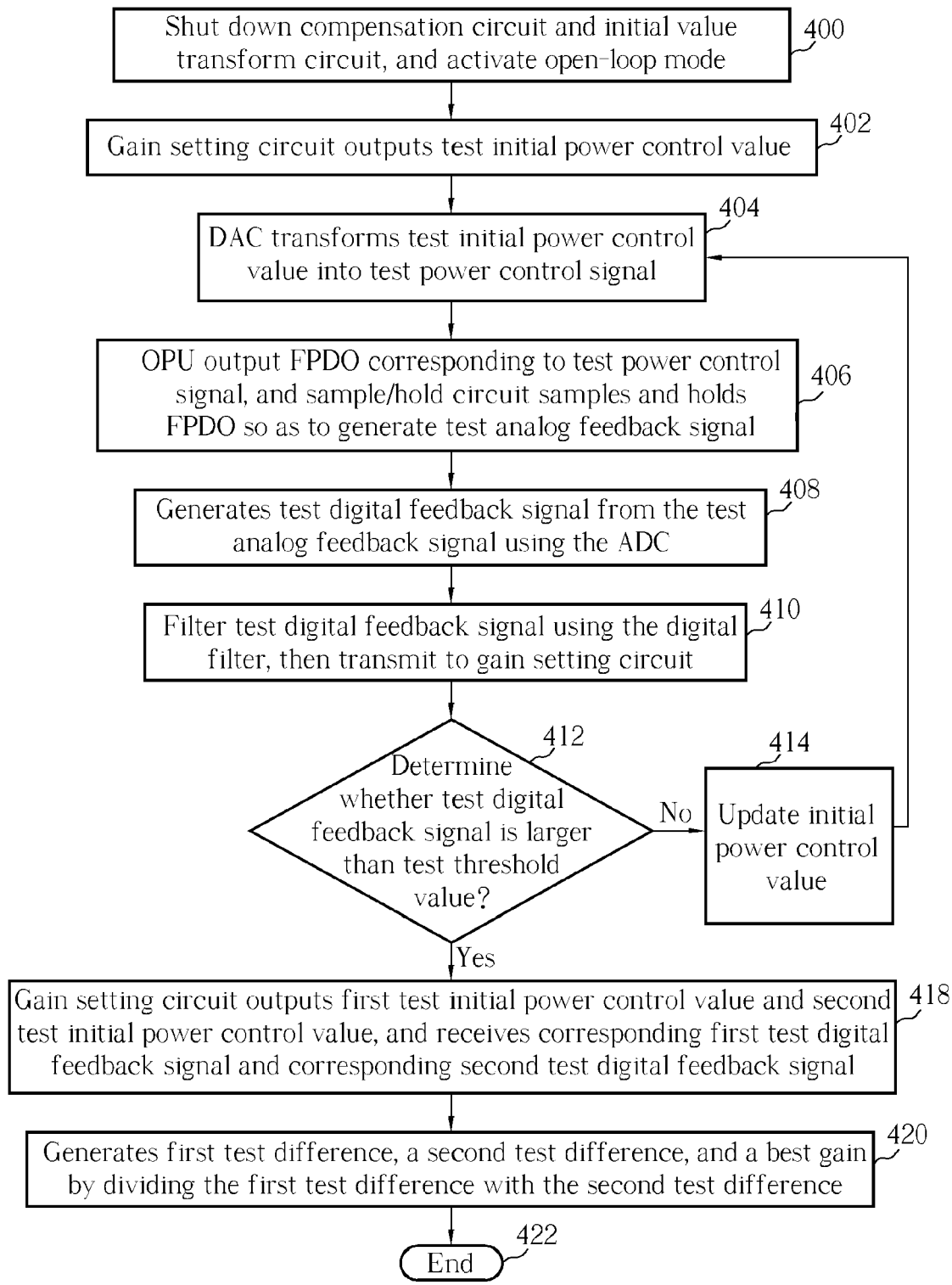
FIG. 4 is a flowchart of searching for the best gain of the compensation circuit shown in FIG. 3 according to the present invention.

Before the laser power control circuit 200 begins the closed-loop automatic power control, the gain setting circuit 217 has to set the gain adopted in the compensation circuit 214. Please refer to FIG. 4. FIG. 4 is a flowchart of searching for the best gain of the compensation circuit 214 shown in FIG. 3 according to present invention. The operation of searching for the best gain is accomplished in an open-loop mode, which means that the magnitude of the FPDO will not influence the power control value inputted into the DAC 218 through the compensation circuit Therefore, this embodiment activates either open-loop or closed-loop by controlling the compensation circuit 214. In other words, when the compensation circuit 214 is activated, the laser power control circuit 200 is in closed-loop mode so that the compensation circuit 214 outputs the compensation value Dc to calibrate the power control value Do. On the other hand, when the compensation circuit 214 is shut down, the laser power control circuit 200 is in open-loop mode so that the compensation circuit 214 is not capable of modifying the power control value Do according to the difference between the digital feedback signal Fd and the digital target feedback signal Ft since it is regarded as an open circuit. In this embodiment, the following steps are used for searching for the best gain:

Step 400: Shut down the compensation circuit 214 and the initial value transform circuit 216, and activate the open-loop mode.

Step 402: The gain setting circuit 217 outputs a test initial power control value WDAC.

Step 404: The DAC 218 transforms the test initial power control value WDAC into a test power control signal.

Step 406: The OPU outputs the FPDO corresponding to the test power control signal, and the sample/hold circuit 202a samples and holds the FPDO so as to generate a test analog feedback signal.

Step 408: Generate a test digital feedback signal from the test analog feedback signal through the ADC 204.

Step 410: Filter the test digital feedback signal through the digital filter 212, then transmit the filtered test digital feedback signal to the gain setting circuit 217.

Step 412: The gain setting circuit 217 determines whether the test digital feedback signal is larger than a test threshold value. If yes, proceed to step 418; otherwise, if no, proceed to step 414.

Step 414: The gain setting circuit 217 updates the initial power control value WDAC by adding an adding value to the initial power control value WDAC, and then returns to step 404.

Step 418: The gain setting circuit 217 outputs a first test initial power control value and a second test initial power control value, and receives a corresponding first test digital feedback signal and a corresponding second test digital feedback signal.

Step 420: The gain setting circuit 217 generates a first test difference by subtracting the second test digital feedback signal with the first test digital feedback signal, a second test difference by subtracting the second test initial power control signal with the first test initial power control signal, and a best gain by dividing the first test difference with the second test difference.

Step 422: End.

As mentioned above, when searching for the best gain, the laser power control circuit 200 operates in the open-loop mode. Therefore, the compensation circuit 214 and the initial value transform circuit 216 do not need to be activated (step 400). The gain setting circuit 217 will first output the test initial power control value WDAC (such as WDAC=0), and read the test digital feedback signal corresponding to the test initial power control value WDAC (steps 402 to 410). In this embodiment, the gain setting circuit 217 determines whether the test digital feedback signal has reached a test threshold value (step 412). For example, the gain setting circuit 217 determines whether the test digital feedback signal is larger than zero. If the test digital feedback signal has not reached the test threshold value, the gain setting value 217 increases the original test initial power control value WDAC. For example, the gain setting circuit 217 modifies the test initial power control value WDAC according to the equation below:

$$WDAC=WDAC+1$$

Here the gain setting circuit 217 uses an adding value of 1. However, please note that the gain setting circuit 217 is capable of applying any value as the adding value. In the present embodiment, the objective of setting the test threshold value is to check whether or not the outputted laser power lies in a certain operational range so that the influence of the feedback signal noise is eliminated. Thus the following calculation of gain generates the best result. Assuming that when the test initial power control value WDAC equals the value of a power control value Wth, the corresponding test digital feedback signal will reach the test threshold value so that the gain setting circuit 217 begins to search for the appropriate gain value. Meanwhile, the gain setting circuit 217 outputs a first test initial power control value (such WDAC1) and a second test initial power control value (such as WDAC2), and receive a corresponding first test digital feedback signal (such as Fd1) and second test digital feedback signal (such as Fd2). Please note that the first and second test initial power control values are larger than the above-mentioned power control value Wth, and the second test initial power control value is larger than the first test initial power control value (step 418). Continuing, the gain setting circuit 217 generates the best gain Gain according to the following equation:

$$Gain = \frac{WDAC2 - WDAC1}{Fd2 - Fd1}$$

Figure 5:
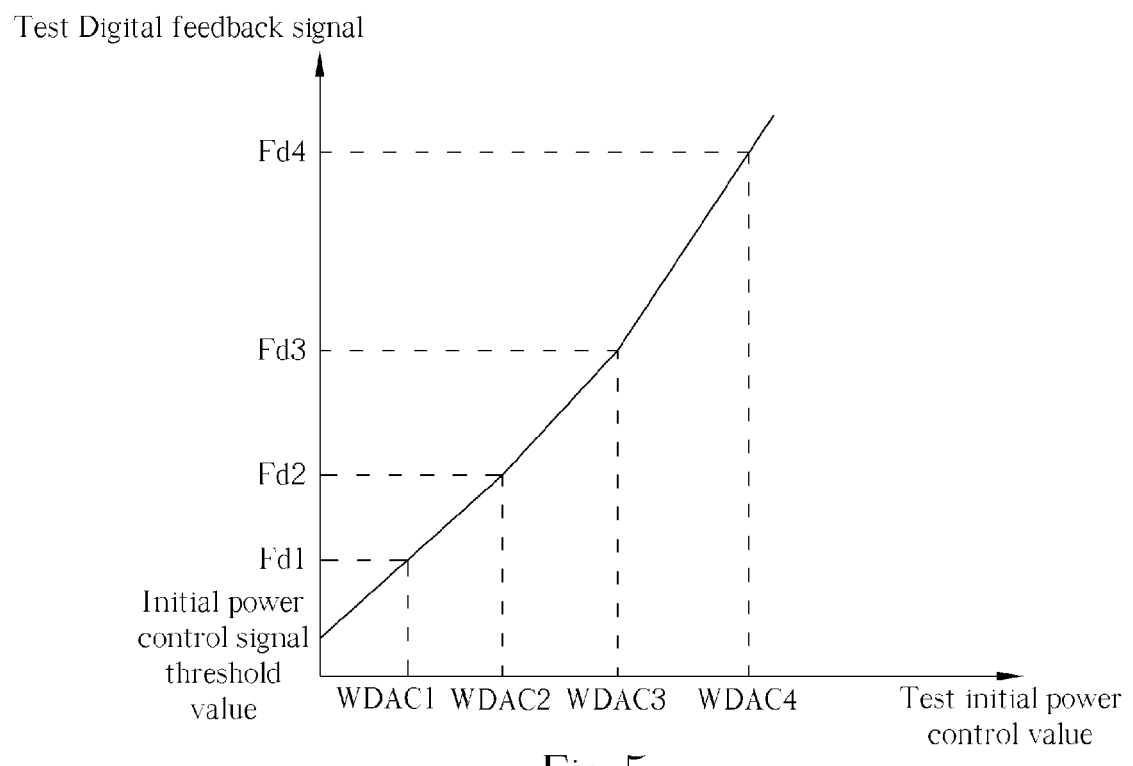
FIG. 5 is a diagram of searching for the best gain of the gain setting circuit shown in FIG. 3 according to the present invention.

Therefore, the best gain Gain corresponding to the operation range defined by the first and second test initial power control values is generated after step 420. Please refer to FIG. 5. FIG. 5 is a diagram of searching for the best gain of the gain setting circuit shown in FIG. 3 according to present invention, wherein the x-coordinate represents the test initial power control value, and the y-coordinate represents the test digital feedback signal. As mentioned above, the best gain corresponding to an operation range WDAC1~WDAC2 is generated according to the power control values WDAC1, WDAC2 and the corresponding digital feedback signals Fd1 and Fd2. Moreover, the gain setting circuit 217 searches for the best gain corresponding to different operation ranges according to different power control value and the corresponding digital feedback signal. For example, the best gain corresponding to a operation range WDAC3~WDAC4 is generated according to the power control values WDAC3, WDAC4 and the corresponding digital feedback signals Fd3, Fd4, and the best gain corresponding to an operation range WDAC2~WDAC3 according to the power control value WDAC2, WDAC3 and the corresponding digital feedback signal Fd2, Fd3. In order to reduce the influence of the signal noise and error, the best gain is generated according to this modified equation:

$$Gain = \frac{WDAC2 - WDAC1}{Fd2 - Fd1}$$

*K, 2>K>0

Figure 6:
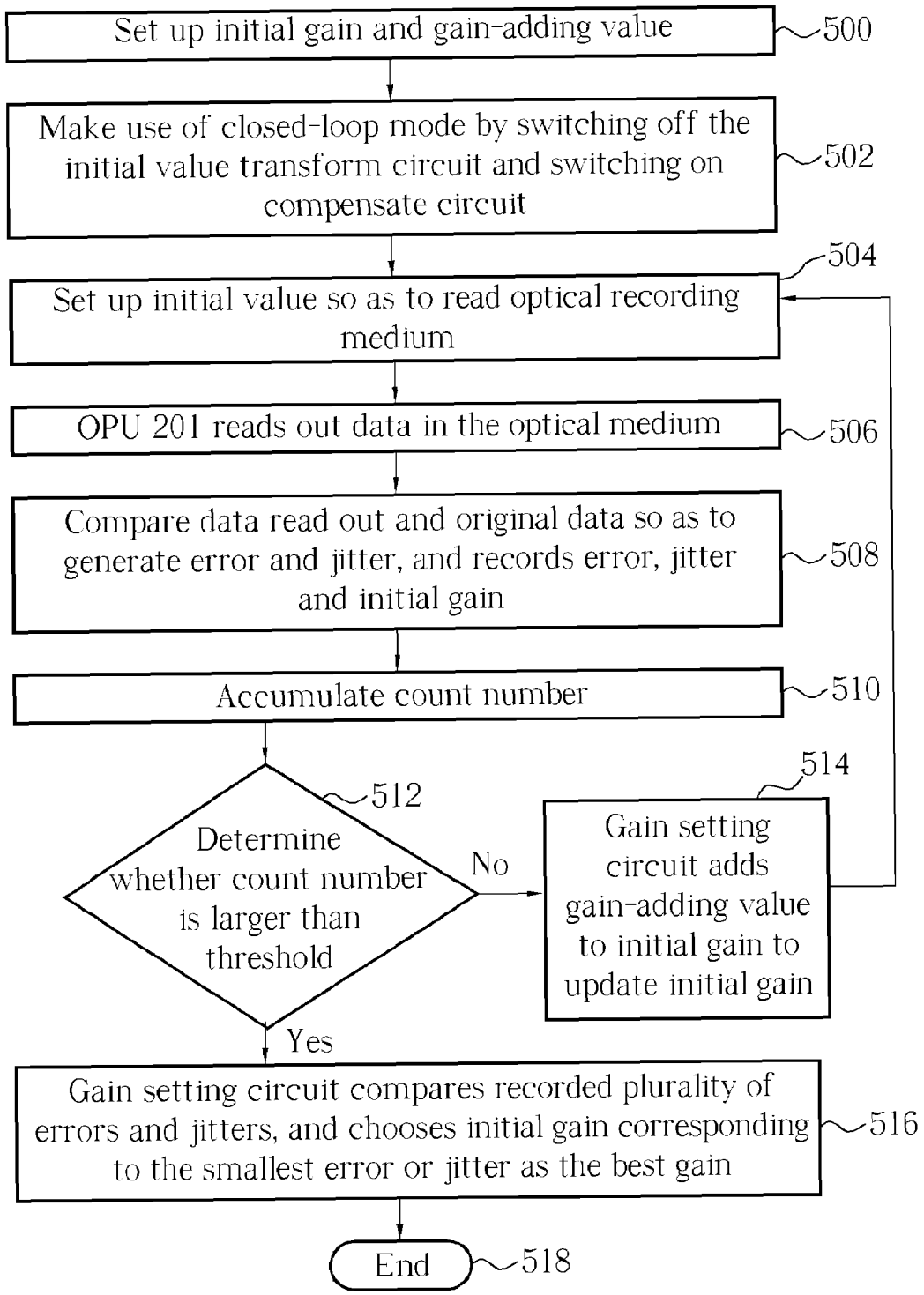
FIG. 6 is another diagram of searching for the best gain of the gain setting circuit shown in FIG. 3 according to the present invention.

The above equation is not the only way to generate the best gain. The best gain could also be generated according to the error rate and jitter. Please refer to FIG. 6. FIG. 6 is another diagram of searching for the best gain of the gain setting circuit shown in FIG. 3 according to present invention and includes the following steps:

Step 500: Set up an initial gain Gi and a gain-adding value.

Step 502: Make use of closed-loop mode by switching off the initial value transform circuit 216 and switching on the compensation circuit 214.

Step 504: The gain setting circuit 217 sets up the initial value Gi so as to read an optical recording medium.

Step 506: The OPU 201 reads out data from the optical recording medium.

Step 508: The gain setting circuit 217 compares the data read out and the original data so as to generate an error Ei and a jitter Ji, and records the error Ei, the jitter Ji and the initial gain Gi.

Step 510: Accumulate a count number Co.

Step 512: Determine whether the count number Co is larger than a threshold Ct. If yes, proceed to step 516; otherwise, if no, proceed to step 514.

Step 514: The gain setting circuit 217 adds the gain-adding value to the initial gain Gi to update the initial gain, and returns to step 504.

Step 516: The gain setting circuit 217 compares the recorded plurality of errors and jitters, and chooses an initial gain corresponding to the smallest error or jitter as the best gain.

Step 518: End.

First of all, an initial gain Gi and a gain-adding value must be set up. Then, make use of closed-loop control by switching off the initial value transform circuit and switching on the compensation circuit. After then, the data are read out from the medium so as to record the error and the jitter. Moreover, different gains Gi are set up in order to use the closed-loop control and read the error Ei and the jitter Ji of the data. After performing the above steps several times, the best gain that has the least error Ei or the least jitter Ji can be found. Repeating the above steps one more time will result in a more accurate gain while the best gain just found can be set up as the initial gain Gi", and the gain adding value can be set up as a reduced number.

Different gains are set up in the above-mentioned steps for different power controls. After writing data onto the optical record medium, the best gain is found according to different statuses of different discs and the least error and jitter.

Figure 7:
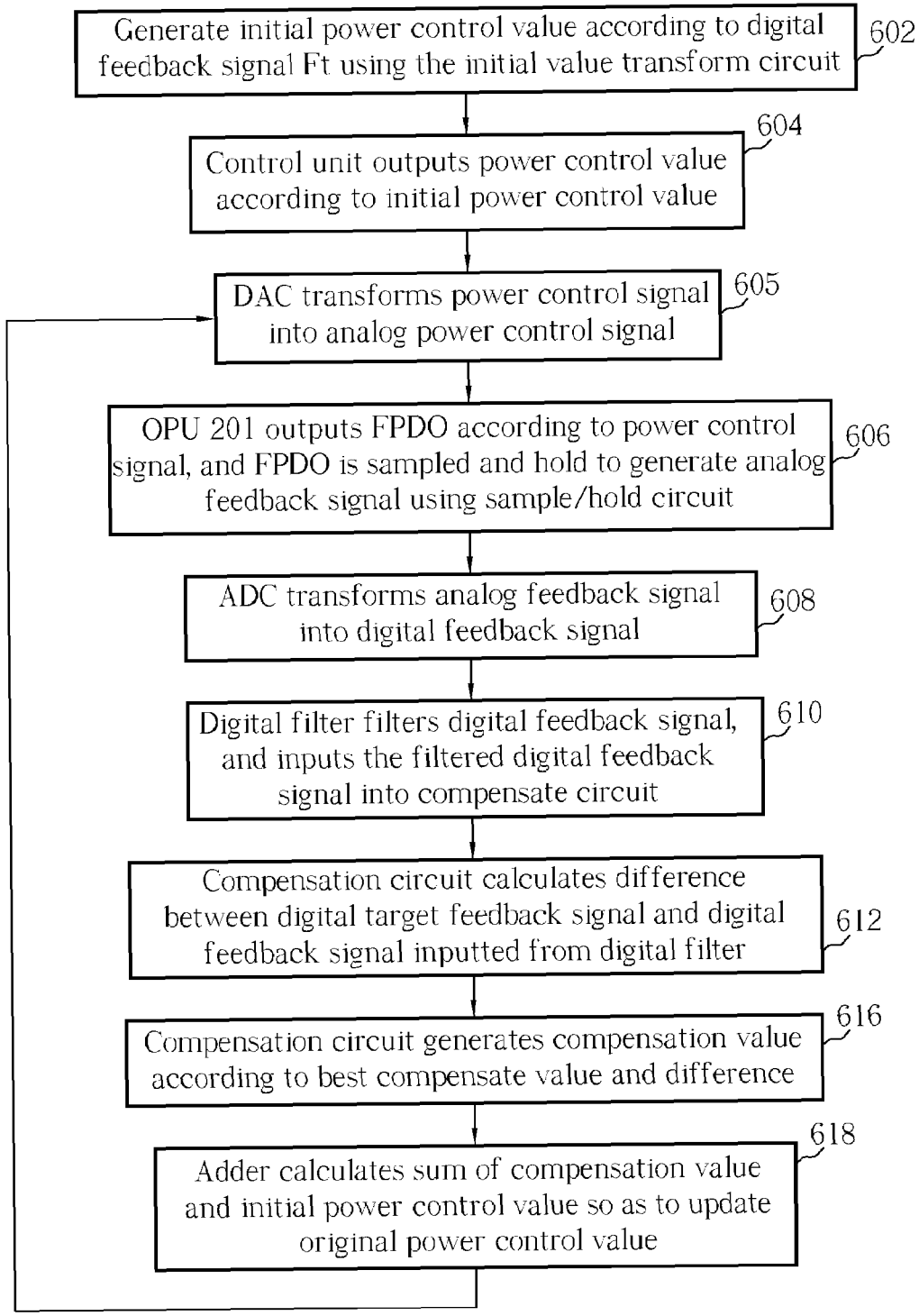
FIG. 7 is a flowchart of automatic power control preformed by the laser power control circuit according to the present invention.

When the laser power control circuit 200 uses closed-loop control to perform automatic power control, the compensation circuit 214 sets up the best gain so as to, in a very short time, lock the power control value Do. Please refer to FIG. 7. FIG. 7 is a flowchart of automatic power control preformed by the laser power control circuit 200 according to present invention. The steps of the automatic power control are illustrated below.

Step 602: Generate an initial power control value Di according to a digital feedback signal Ft using the initial value transform circuit 216.

Step 604: The control unit 208 outputs a power control value Do according to the initial power control value Di.

Step 605: The DAC 218 transforms the power control signal Do into an analog power control signal Sc.

Step 606: The OPU 201 outputs the FPDO according to the power control signal Sc, and the FPDO is sampled and hold to generate an analog feedback signal Fa1 or Fa2 using the sample/hold circuit 202a or 202b.

Step 608: The ADC 204 transforms the analog feedback signal Fa1 or Fa2 into a digital feedback signal Fd.

Step 610: The digital filter 212 filters the digital feedback signal Fd, and inputs the filtered digital feedback signal Fd into the compensation circuit 214.

Step 612: The compensation circuit 214 calculates the difference between the digital target feedback signal Ft and the digital feedback signal inputted from the digital filter 212.

Step 616: The compensation circuit 214 generates a compensation value Dc according to a best compensation value and the difference.

Step 618: The adder 215 calculates the sum of the compensation value Dc and the initial power control value Di so as to update the original power control value Do, and returns to step 605.

Figure 8:
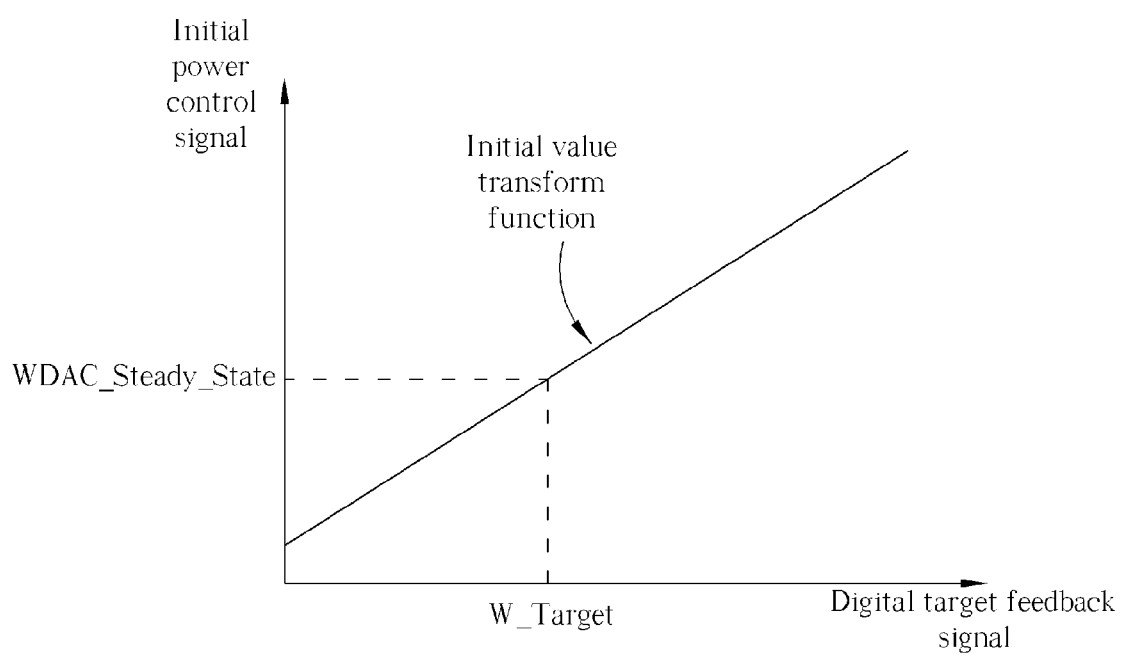
FIG. 8 is a diagram of an initial value transform function used in the initial value transform circuit according to the present invention.

As mentioned above, when the laser power control circuit 200 activates the automatic power control, the control unit 208 uses closed-loop control to adjust the power control value Do. From the beginning, the compensation circuit 214 does not output the compensation value Dc, so that the power control value Do is controlled merely according to the initial power control value Di generated by the initial transform circuit 216 (step 602 and 604). Please refer to FIG. 8. FIG. 8 is a diagram of an initial value transform function used in the initial value transform circuit 216 shown in FIG. 3 according to the present invention. The x-coordinate represents the digital target feedback signal and the y-coordinate represents the initial power control value. The initial value transform function corresponds to the characteristics of the elements of the OPU 201. This means that when the transform circuit 216 is switched off and the DAC 218 generates a power control signal Sc to drive the OPU 201 to output a target laser power according to the power control value WDAC_steady_state that the compensation circuit 214 outputs in closed-loop control, the FPDO outputs by the OPU 201 corresponds to a digital target feedback signal W_target (shown in FIG. 8). However, the operation temperature variance of the OPU 201 and changes in some other characteristics of the elements result in unsuccessfully driving the OPU 201 to output the target laser power. Therefore the compensation 214 must finely tune the power control value Do.

Assume that the target laser power is the bias power Pb shown in FIG. 2 so that the sample/hold circuit 202a activates the analog feedback signal Fa1. Therefore, from steps 605 to 610, the compensation circuit 214 receives the digital feedback signal Fd corresponding to the initial power control value Di. In an ideal situation, the digital feedback signal Ft should equal the digital target feedback signal Ft. However, there is a difference between the digital feedback signal Fd and the digital feedback signal Ft. If the digital feedback signal Fd is larger than the digital target feedback signal Ft, this means that the power control value Do is too large; on the contrary, if the digital feedback signal Fd is smaller than the digital target feedback signal Ft, this means that the power control value is too small. Therefore the compensation circuit 214 calculates the difference, and generates a compensation value Dc according to a best compensation value and the difference. Finally, the adder 215 updates the original power control value Do (steps 612, 616 and 618). In the present invention, if the digital feedback signal Fd is larger than the digital target feedback signal Ft, the compensation value Dc is a negative value so as to reduce the power control value Do. If the digital feedback signal Fd is smaller than the digital target feedback signal Ft, the compensation value Dc is a positive value so as to increase the power control value Do. Therefore, via closed-loop control mechanism, the difference will be reduced, and the digital feedback signal Fd will finally approach the digital target feedback signal Ft. Meanwhile the OPU 201 will correctly output the target laser power.

On the other hand, in the situation of buffer under-run and malfunction of the disc servo system which could influence the quality of writing data on the medium, the upper level controller of the disk driver will immediately interrupt the data writing process until the data bit-stream and the servo signal become more steady and the upper controller of the disc drive will perform the linking writing. When immediate interruption of writing occurs in high-speed data writing and the linking writing is performed, if the laser power does not reach the steady state in time, a bad jitter will occur which results in an error. The digital laser power control circuit in the present invention further comprises a switch (not shown in the figure), which is opened so as to keep the final output status (WDAC_link), and output the steady state power control signal (WDAC_link). Therefore the power is capable of being stabilized very quickly, and the data will not be unreadable.

Please note that there are two sample/hold circuits 202*a* and 202*b* adopted in the present embodiment. However, the number of sample/hold circuits, ADCs or DACs in the embodiment is not limited. For example, the laser power control circuit 200 is capable of using three sample/hold circuits respectively corresponding to the write power, erase power, and bias power shown in FIG. 2. On the other hand, the OPU 201 is an element controlled by an analog signal in this embodiment, so the laser power control circuit 200 generates the analog power control signal through the DAC 218. However, if the OPU 201 is an element controlled by a digital signal, the laser power control circuit 200 needs no DAC 218 and can directly output the power control value Do to the OPU 201. The above-mentioned structures are used for controlling the OPU 201. Moreover, the control unit 208 uses an output power protection mechanism (not shown in the figure), so that the output power is limited to a specific range. The objective of this mechanism is to avoid damage of the OPU. Therefore, the mechanism limits the power control value and outputs the power as the maximum value of the range when the original output power control value is larger than the maximum of the range.

The laser power control circuit and the relative control method in the present invention adopt sample/hold circuits so that the present invention is capable of being applied to high-speed read-and-write optical recording devices. Additionally, the laser power control circuit and the relative control method disclose a digital control circuit that adjusts the output power to a best value by setting the best gain, and modifies the output power to the target power in a short time to enhance the reading and writing performance of the optical record medium.

Those skilled in the art will readily observe that numerous modifications and alterations of the device may be made while retaining the teachings of the invention. Accordingly, the above disclosure should be construed as limited only be the metes and bounds of the appended claims.

What is claimed is:

1. A laser power control circuit used for controlling the laser power of an optical pick-up unit (OPU), the laser power control circuit comprising:
    at least one sample/hold circuit electronically connected to the OPU for sampling and holding a front photodiode output signal to generate an analog feedback signal;
    at least one analog-to-digital converter (ADC) electrically coupled to the sample/hold circuit for transferring the analog feedback signal into a digital feedback signal; and
    at least one digital control circuit electrically coupled to the ADC for generating a power control signal and outputting the power control signal to the OPU in order to control the laser power of the OPU, the digital control circuit comprising:
        an initial value transform circuit used for transforming a digital target feedback signal into an initial power control value to initialize the power control signal; and
        a compensation circuit used for generating a compensation value according to a difference between the digital feedback signal corresponding to the initial power control value, and the digital target feedback signal so as to adjust the power control signal;
    wherein the front photodiode output signal corresponds to the laser power of the OPU.

2. The laser power control circuit in claim 1, wherein the digital control circuit further comprises:
    an adder electronically connected to the initial value transform circuit and the compensation circuit for calculating the sum of the compensation value and the initial control value so as to set up the power control value.

3. The laser power control circuit in claim 1, wherein the digital control circuit further comprises a digital filter electronically connected to the compensation circuit for filtering the digital feedback signal.

4. The laser power control circuit in claim 1, wherein the digital control circuit further comprises a gain setting circuit for setting the gain of the compensation circuit, and the compensation circuit generates the compensation value according to the gain value and the difference.

5. The laser power control circuit in claim 1, wherein the digital control circuit limits the value of the power control signal within a specific range.

6. The laser power control circuit in claim 1, wherein the power control signal is a digital signal.

7. The laser power control circuit in claim 1, further comprising a plurality of sample/hold circuits electronically connected to the OPU and corresponding to a plurality of predetermined output powers, respectively, wherein if the laser power control circuit is to drive the OPU to output a predetermined output power, a sample/hold circuit corresponding to the predetermined output power is activated.

8. A method for controlling the laser power of an OPU, the method comprising:
    generating an initial power control value to initialize a power control signal to control the OPU according to a digital target feedback signal;
    sampling and holding a front photodiode output signal to generate an analog feedback signal;
    transforming the analog feedback signal into a digital feedback signal;
    generating a compensation value to the initial power control value according to a difference between the digital feedback signal and the digital target feedback signal so as to adjust the power control; and
    outputting the adjusted power control signal to the OPU so as to control the laser power of the OPU;
    wherein the front photodiode output signal corresponds to the laser power of the OPU.

9. The method of claim 8, wherein the step of adjusting the power control value comprises calculating the sum of the compensation value and the initial power control value so as to set the power control value.

10. The method of claim 8, wherein the step of calculating the power control value further comprises filtering the digital feedback signal.

11. The method of claim 8, further comprising setting a gain, wherein the step of calculating the power control value further comprises generating the compensation value according to the gain and the difference.

12. The method of claim 11, wherein the step of setting the gain further comprises:
    driving the OPU using a first power control value and a second power control value;
    reading a first digital feedback signal corresponding to the first power control value and a second digital feedback signal corresponding to the second power control value; and
    calculating the gain according to the first power control value, the second power control value, the first digital feedback signal, and the second digital feedback signal.

13. The method of claim 11, wherein the step of setting the gain further comprises:
    calculating the gain according to the first power control value, the second power control value, the first digital feedback signal, the second digital feedback signal, and a specific value.

14. The method of claim 11, wherein the step of setting the gain further comprises:
    reading an optical recording medium according to a plurality of predetermined gains;
    recording a plurality of the error values and jitter values corresponding to the plurality of predetermined gains; and
    selecting one predetermined gain among the plurality of predetermined gains as the gain according to the plurality of error values and jitter values.

15. The method of claim 11, wherein the step of setting the gain further comprises:
    using at least one power control value to continuously drive the OPU so as to make the laser power reach a specific magnitude before using the first and second power control value to drive the OPU.

16. The method of claim 15, wherein the step of continuously driving the OPU comprises using a plurality of power control values in sequence to drive the OPU, wherein a next power control value is larger than a present power control value, and the value of the digital feedback signal corresponding to the last power control value is larger than a predetermined value.

17. The method of claim 8, wherein the step of calculating the power control value further comprises limiting the value of the power control signal to a specific range.

18. The method of claim 8, wherein the step of sampling and holding the front photodiode output signal further comprises:
    providing a plurality of sample/hold circuits, which correspond to a plurality of predetermined output powers of the OPU; and
    controlling the OPU to output a predetermined output power and activating a sample/hold circuit corresponding to the predetermined output power.

19. The method of claim 8, further comprising a step of holding the power control signal.

20. A laser power control circuit used for controlling the laser power of an optical pick-up unit (OPU), the laser power control circuit comprising:
    a plurality of sample/hold circuits, electronically connected to the OPU and corresponding to a plurality of predetermined output powers respectively, each of the plurality of sample/hold circuits utilized for sampling and holding a front photodiode output signal to generate an analog feedback signal, wherein if the laser power control circuit is to drive the OPU to output a predetermined output power, a sample/hold circuit corresponding to the predetermined output power is activated;
    at least one analog-to-digital converter (ADC), electrically coupled to the plurality of sample/hold circuits, for transferring the analog feedback signal into a digital feedback signal; and
    at least one digital control circuit, electrically coupled to the ADC, for generating a power control signal and outputting the power control signal to the OPU in order to control the laser power of the OPU;
    wherein the front photodiode output signal corresponds to the laser power of the OPU.

21. A method for controlling the laser power of an OPU, the method comprising:
    providing a plurality of sample/hold circuits, which correspond to a plurality of predetermined output powers of the OPU;
    controlling the OPU to output a predetermined output power, and activating a sample/hold circuit corresponding to the predetermined output power for sampling and holding a front photodiode output signal to generate an analog feedback signal;
    transforming the analog feedback signal into a digital feedback signal; and
    generating a power control signal according to the digital feedback signal, and
    outputting the power control signal to the OPU so as to control the laser power of the OPU;
    wherein the front photodiode output signal corresponds to the laser power of the OPU.

* * * * *